United States Patent
Chen et al.

(10) Patent No.: US 10,536,160 B2
(45) Date of Patent: Jan. 14, 2020

(54) PIPELINED ANALOG-TO-DIGITAL CONVERTER HAVING OPERATIONAL AMPLIFIER SHARED BY DIFFERENT CIRCUIT STAGES

(71) Applicant: Realtek Semiconductor Corp., Hsinchu (TW)

(72) Inventors: Chih-Lung Chen, Hsinchu County (TW); Shih-Hsiung Huang, Miaoli County (TW); Chien-Ming Wu, Hsinchu County (TW); Jie-Fan Lai, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 18 days.

(21) Appl. No.: 16/158,948

(22) Filed: Oct. 12, 2018

(65) Prior Publication Data
US 2019/0123757 A1 Apr. 25, 2019

(30) Foreign Application Priority Data
Oct. 25, 2017 (TW) .............................. 106136797 A

(51) Int. Cl.
*H03M 1/38* (2006.01)
*H03M 1/44* (2006.01)
(Continued)

(52) U.S. Cl.
CPC ........... *H03M 1/442* (2013.01); *H03M 1/164* (2013.01); *H03M 1/1245* (2013.01)

(58) Field of Classification Search
CPC .. H03M 1/442; H03M 1/0695; H03M 1/1245; H03M 1/804; H03M 1/806; H03M 1/00; H03M 1/12
(Continued)

(56) References Cited

U.S. PATENT DOCUMENTS 4,555,668 A * 11/1985 Gregorian ................ H03G 1/04
330/107
5,574,457 A * 11/1996 Garrity .................... H03F 3/005
341/155
(Continued)

OTHER PUBLICATIONS

Huang et al., "A 0.02-mm² 9-Bit 50-MS/s Cyclic ADC in 90-nm Digital CMOS Technology", IEEE Journal of Solid-State Circuits, Mar. 2010, vol. 45, No. 3, pp. 610-619.
(Continued)

*Primary Examiner* — Jean B Jeanglaude
(74) *Attorney, Agent, or Firm* — Birch, Stewart, Kolasch & Birch, LLP

(57) ABSTRACT

A pipelined analog-to-digital converter includes: a first switched capacitor network, a first digital-to-analog converter, a second switched capacitor network, a second digital-to-analog converter, and an operational amplifier. The outputs from the first switched capacitor network and the first digital-to-analog converter form a first subtraction signal. The outputs from the second switched capacitor network and the second digital-to-analog converter form a second subtraction signal. The operational amplifier is arranged to operably generate an output signal based on the first subtraction signal or the second subtraction signal, and to operably switch coupling relationship of multiple candidate capacitors of the operational amplifier based on the magnitude of an input signal of a prior stage circuit, so that only a portion of the multiple candidate capacitors could be participated in the generation of the output signal at a time.

10 Claims, 7 Drawing Sheets

(51) Int. Cl.
*H03M 1/16* (2006.01)
*H03M 1/12* (2006.01)

(58) Field of Classification Search
USPC .................................................. 341/161, 155
See application file for complete search history.

(56) References Cited

U.S. PATENT DOCUMENTS

| | | | | |
|---|---|---|---|---|
| 6,011,433 | A * | 1/2000 | Nairn | H03F 3/005 |
| | | | | 330/2 |
| 6,362,770 | B1 * | 3/2002 | Miller | H03M 1/1225 |
| | | | | 327/553 |
| 6,879,277 | B1 * | 4/2005 | Cai | H03M 1/164 |
| | | | | 341/155 |
| 7,161,516 | B2 * | 1/2007 | Hakkarainen | H01L 27/0805 |
| | | | | 257/E27.048 |
| 7,307,572 | B2 * | 12/2007 | Garrity | H03M 1/1225 |
| | | | | 341/122 |
| 7,414,464 | B2 * | 8/2008 | Lin | H03F 3/45183 |
| | | | | 330/260 |
| 7,453,136 | B2 * | 11/2008 | Hakkarainen | H01L 27/0805 |
| | | | | 257/532 |
| 7,612,700 | B2 | 11/2009 | Kawahito et al. | |
| 9,118,341 | B2 * | 8/2015 | Matsumoto | H03M 3/332 |
| 9,236,879 | B2 * | 1/2016 | Kawahito | H03M 1/18 |
| 9,344,798 | B2 * | 5/2016 | Goldman | H04M 1/6066 |
| 9,748,964 | B1 * | 8/2017 | Kabir | H03M 1/123 |
| 10,069,507 | B1 * | 9/2018 | Hoseini | H03M 1/442 |
| 2011/0148500 | A1 | 6/2011 | Huang | |

OTHER PUBLICATIONS

Office Action dated May 8, 2019 in corresponding U.S. Appl. No. 16/158,916.

* cited by examiner

PIPELINED ANALOG-TO-DIGITAL CONVERTER HAVING OPERATIONAL AMPLIFIER SHARED BY DIFFERENT CIRCUIT STAGES

CROSS-REFERENCE TO RELATED APPLICATIONS

This application claims the benefit of priority to Patent Application No. 106136797, filed in Taiwan on Oct. 25, 2017; the entirety of which is incorporated herein by reference for all purposes.

BACKGROUND

The disclosure generally relates to an analog-to-digital converter and, more particularly, to a pipelined analog-to-digital converter that can be shared by different circuit stages.

Operational amplifiers are typically employed in a conventional pipelined analog-to-digital converter, but the overall performance or operating speed of the pipelined analog-to-digital converter is typically restricted by the response speed of the operational amplifiers. As is well known in related art, the length of time required for charging or discharging the feedback capacitors within the operational amplifier has a great influence to the response speed of the operational amplifier. It would be difficult to increase the overall performance or operating speed of the conventional pipelined analog-to-digital converter if the required time for charging or discharging the feedback capacitors within the operational amplifiers cannot be substantially reduced.

SUMMARY

An example embodiment of a pipelined analog-to-digital converter is disclosed, comprising: a first switched capacitor network arranged to operably conduct a sample-and-hold operation on a first input signal; a first DAC arranged to operably generate a first analog signal corresponding to the first input signal, wherein outputs of the first switched capacitor network and the first DAC form a first subtracted signal; a second switched capacitor network arranged to operably conduct a sample-and-hold operation on a second input signal; a second DAC arranged to operably generate a second analog signal corresponding to the second input signal, wherein outputs of the second switched capacitor network and the second DAC form a second subtracted signal; and an operational amplifier comprising multiple candidate capacitors, and arranged to operably generate an output signal according to a first signal and arranged to operably switch coupling relationships of the multiple candidate capacitors according to a magnitude of an input signal, so that only part of the multiple candidate capacitors are employed to participate in the generation of the output signal at the same time; wherein the operational amplifier utilizes the first input signal to be the input signal when the operational amplifier utilizes the first subtracted signal to be the first signal; and the operational amplifier utilizes the second input signal to be the input signal when the operational amplifier utilizes the second subtracted signal to be the first signal.

Another example embodiment of a pipelined analog-to-digital converter is disclosed, comprising: a first switched capacitor network arranged to operably conduct a sample-and-hold operation on a first input signal; a first DAC arranged to operably generate a first analog signal corresponding to the first input signal, wherein outputs of the first switched capacitor network and the first DAC form a first subtracted signal; a second switched capacitor network arranged to operably conduct a sample-and-hold operation on a second input signal; a second DAC arranged to operably generate a second analog signal corresponding to the second input signal, wherein outputs of the second switched capacitor network and the second DAC form a second subtracted signal; and an operational amplifier comprising multiple candidate capacitors, and arranged to operably generate an output signal according to a first signal and arranged to operably switch coupling relationships of the multiple candidate capacitors based on a magnitude of an input signal, so that only part of the multiple candidate capacitors are employed to participate in the generation of the output signal; wherein the operational amplifier utilizes the first input signal to be the input signal when the operational amplifier utilizes the first subtracted signal to be the first signal; and the operational amplifier utilizes the second input signal to be the input signal when the operational amplifier utilizes the second subtracted signal to be the first signal; wherein the multiple candidate capacitors are divided into a first capacitor group and a second capacitor group, and when part of candidate capacitors in the first capacitor group are employed in the generation of the output signal, all candidate capacitors in the second capacitor group are respectively charged to have different cross voltage values.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
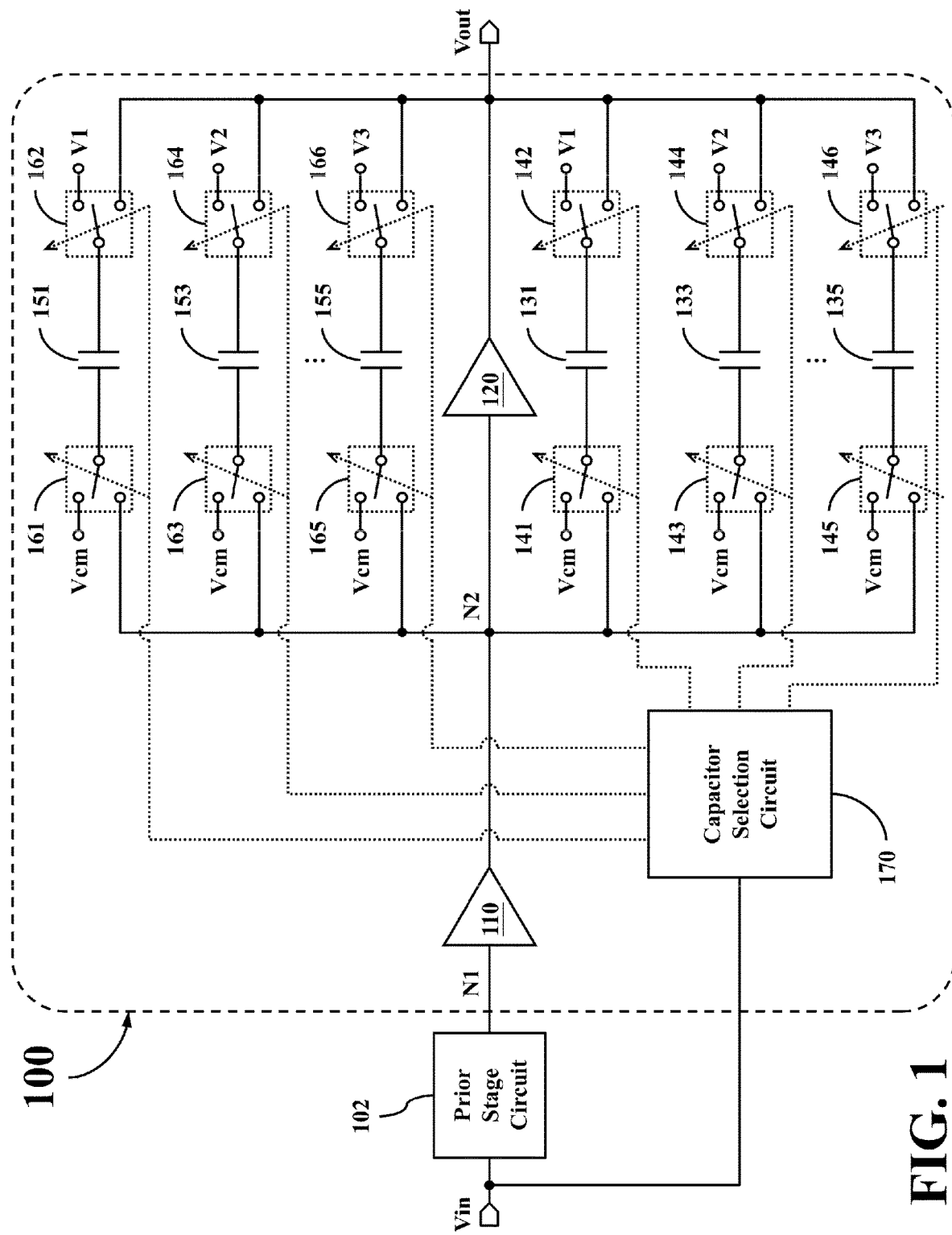
FIG. 1 shows a simplified functional block diagram of an operational amplifier according to one embodiment of the present disclosure.

FIG. 1 shows a simplified functional block diagram of an operational amplifier 100 according to one embodiment of the present disclosure. The operational amplifier 100 comprises a first gain stage 110, a second gain stage 120, multiple candidate capacitors, multiple switches, and a capacitor selection circuit 170.

For the purpose of explanatory convenience in the specification, FIG. 1 shows candidate capacitors 131, 133, and 135 (hereinafter, the first through the third candidate capacitors), candidate capacitors 151, 153, and 155 (hereinafter, the fourth through the sixth candidate capacitors), switches 141-146 (hereinafter, the first through the sixth switches), and switches 161-166 (hereinafter, the seventh through the twelfth switches) as exemplary components of the operational amplifier 100.

In the operational amplifier 100, the first gain stage 110 is arranged to operably generate a second signal N2 according to a first signal N1 transmitted from a prior stage circuit 102. The prior stage circuit 102 may be realized with various suitable circuits comprising one or more switched capacitor networks.

The second gain stage 120 is coupled with the first gain stage 110, and arranged to operably generate an output signal Vout of the operational amplifier 100 according to the second signal N2.

As shown, the first switch 141 is coupled with a first terminal of the first candidate capacitor 131, and arranged to selectively couple the first candidate capacitor 131 to a first predetermined voltage Vcm or the input terminal of the second gain stage 120.

The second switch 142 is coupled with a second terminal of the first candidate capacitor 131, and arranged to selectively couple the first candidate capacitor 131 to a first voltage V1 or the output terminal of the second gain stage 120.

The third switch 143 is coupled with a first terminal of the second candidate capacitor 133, and arranged to selectively couple the second candidate capacitor 133 to the first predetermined voltage Vcm or the input terminal of the second gain stage 120.

The fourth switch 144 is coupled with a second terminal of the second candidate capacitor 133, and arranged to selectively couple the second candidate capacitor 133 to a second voltage V2 or the output terminal of the second gain stage 120.

The fifth switch 145 is coupled with a first terminal of the third candidate capacitor 135, and arranged to selectively couple the third candidate capacitor 135 to the first predetermined voltage Vcm or the input terminal of the second gain stage 120.

The sixth switch 146 is coupled with a second terminal of the third candidate capacitor 135, and arranged to selectively couple the third candidate capacitor 135 to a third voltage V3 or the output terminal of the second gain stage 120.

The seventh switch 161 is coupled with a first terminal of the fourth candidate capacitor 151, and arranged to selectively couple the fourth candidate capacitor 151 to the first predetermined voltage Vcm or the input terminal of the second gain stage 120.

The eighth switch 162 is coupled with a second terminal of the fourth candidate capacitor 151, and arranged to selectively couple the fourth candidate capacitor 151 to the first voltage V1 or the output terminal of the second gain stage 120.

The ninth switch 163 is coupled with a first terminal of the fifth candidate capacitor 153, and arranged to selectively couple the fifth candidate capacitor 153 to the first predetermined voltage Vcm or the input terminal of the second gain stage 120.

The tenth switch 164 is coupled with a second terminal of the fifth candidate capacitor 153, and arranged to selectively couple the fifth candidate capacitor 153 to the second voltage V2 or the output terminal of the second gain stage 120.

The eleventh switch 165 is coupled with a first terminal of the sixth candidate capacitor 155, and arranged to selectively couple the sixth candidate capacitor 155 to the first predetermined voltage Vcm or the input terminal of the second gain stage 120.

The twelfth switch 166 is coupled with a second terminal of the sixth candidate capacitor 155, and arranged to selectively couple the sixth candidate capacitor 155 to the third voltage V3 or the output terminal of the second gain stage 120.

The capacitor selection circuit 170 is coupled with the prior stage circuit 102 and the first through the twelfth switches 141-146 and 161-166. The capacitor selection circuit 170 is arranged to operably control the first through the twelfth switches 141-146 and 161-166 based on the magnitude of the input signal Vin of the prior stage circuit 102, so that only part of the first through the sixth candidate capacitors 131-135 and 151-155 can be coupled to the second gain stage 120 at the same time.

It can be appreciated from the foregoing descriptions that the input signal Vin is the input signal of the prior stage circuit 102, and the input signal of the operational amplifier 100 is the first signal N1. The relationship between the magnitude of the input signal Vin of the prior stage circuit 102 and the magnitude of the output signal Vout of the operational amplifier 100 is determined by the gain of the first gain stage 110 and the gain of the second gain stage 120.

In practice, the first through the third voltages V1-V3 mentioned above may be of different voltage values. The aforementioned first predetermined voltage Vcm may be a fixed voltage of a common mode voltage of the second gain stage 120.

Please note that the first gain stage 110 and the second gain stage 120 shown in FIG. 1 are both depicted to have a single-ended structure. This is merely for simplifying the complexity of the drawing, rather than a restriction to the practical implementations. In practice, the first gain stage 110 and the second gain stage 120 in the operational amplifier 100 may both be realized with differential circuits.

In operations, the capacitor selection circuit 170 may synchronously switch the switches at both terminals of a particular candidate capacitor, so that the particular candidate capacitor is either coupled to the second gain stage 120 to participate in the generation of the output signal Vout or coupled to a corresponding charging voltage and then be charged.

For example, when the capacitor selection circuit 170 controls the first switch 141 to couple the first terminal of the first candidate capacitor 131 to the input terminal of the second gain stage 120, the capacitor selection circuit 170 would also control the second switch 142 to couple the second terminal of the first candidate capacitor 131 to the output terminal of the second gain stage 120. In this situation, the first candidate capacitor 131 will be employed to participate in the generation operation of the output signal Vout. On the other hand, when the capacitor selection circuit 170 controls the first switch 141 to couple the first terminal of the first candidate capacitor 131 to the first predetermined voltage Vcm, the capacitor selection circuit 170 would also control the second switch 142 to couple the second terminal of the first candidate capacitor 131 to the first voltage V1. In this situation, the first candidate capacitor 131 will be charged to have a predetermined cross voltage value (i.e., the voltage difference between the first voltage V1 and the first predetermined voltage Vcm in this case).

For another example, when the capacitor selection circuit 170 controls the third switch 143 to couple the first terminal of the second candidate capacitor 133 to the input terminal of the second gain stage 120, the capacitor selection circuit 170 would also control the fourth switch 144 to couple the second terminal of the second candidate capacitor 133 to the output terminal of the second gain stage 120. In this situation, the second candidate capacitor 133 will be employed to participate in the generation operation of the output signal Vout. On the other hand, when the capacitor selection circuit 170 controls the third switch 143 to couple the first terminal of the second candidate capacitor 133 to the first predetermined voltage Vcm, the capacitor selection circuit 170 would also control the fourth switch 144 to couple the second terminal of the second candidate capacitor 133 to the second voltage V2. In this situation, the second candidate capacitor 133 will be charged to have a predetermined cross voltage value (i.e., the voltage difference between the second voltage V2 and the first predetermined voltage Vcm in this case).

For another example, when the capacitor selection circuit 170 controls the eleventh switch 165 to couple the first terminal of the sixth candidate capacitor 155 to the input terminal of the second gain stage 120, the capacitor selection circuit 170 would also control the twelfth switch 166 to couple the second terminal of the sixth candidate capacitor 155 to the output terminal of the second gain stage 120. In this situation, the sixth candidate capacitor 155 will be employed to participate in the generation operation of the output signal Vout. On the other hand, when the capacitor selection circuit 170 controls the eleventh switch 165 to couple the first terminal of the sixth candidate capacitor 155 to the first predetermined voltage Vcm, the capacitor selection circuit 170 would also control the twelfth switch 166 to couple the second terminal of the sixth candidate capacitor 155 to the third voltage V3. In this situation, the sixth candidate capacitor 155 will be charged to have a predetermined cross voltage value (i.e., the voltage difference between the third voltage V3 and the first predetermined voltage Vcm in this case).

The capacitor selection circuit 170 may control the switches at both terminals of other candidate capacitors in similar ways as described previously. For the sake of brevity, similar descriptions will not be repeated here.

In practice, the magnitudes of the first voltage V1, the second voltage V2, and the third voltage V3 are different, and thus different candidate capacitors would have different cross voltage values after being charged.

Each candidate capacitor in the operational amplifier 100 may be realized with a single capacitive component, or may be realized with two or more capacitive components in parallel connection. In addition, each of the first through the twelfth switches 141-146 and 161-166 may be realized with a suitable combination of multiple transistors, or may be realized with a suitable combination of multiple transistors and appropriate logic gates.

In some embodiments, the multiple candidate capacitors 131-135 and 151-155 in the operational amplifier 100 can be divided into two capacitor groups, and these two capacitor groups can be charged by turns. The capacitor selection circuit 170 may select capacitors to be employed to participate in the generation of the output signal Vout from the two capacitor groups by turns, and couple the selected capacitors to the second gain stage 120.

In one embodiment, for example, the first through the third candidate capacitors 131-135 in FIG. 1 may be configured as a first capacitor group, and the fourth through the sixth candidate capacitors 151-155 may be configured as a second capacitor group. In operations, when the capacitor selection circuit 170 selects part of the candidate capacitors in one capacitor group to be selected capacitors for participating in the generation operation of the output signal Vout, the capacitor selection circuit 170 may control the switches corresponding to another capacitor group, so that all of the candidate capacitor in another capacitor group can be charged at the same time.

For example, when the capacitor selection circuit 170 controls related switches to couple some candidate capacitors in the first capacitor group (i.e., the first through the third candidate capacitors 131-135 in this case) to the second gain stage 120, the capacitor selection circuit 170 can also control related switches 161-166 corresponding to the second capacitor group (i.e., the fourth through the sixth candidate capacitors 151-155 in this case) to switch the fourth through the sixth candidate capacitors 151-155 to the charging mode. In this way, the fourth through the sixth candidate capacitors 151-155 will be respectively charged at the same time, so as to have different cross voltage values.

For another example, when the capacitor selection circuit 170 controls related switches to couple some candidate capacitors in the second capacitor group (i.e., the fourth through the sixth candidate capacitors 151-155 in this case) to the second gain stage 120, the capacitor selection circuit 170 can also control related switches 141-146 corresponding to the first capacitor group (i.e., the first through the third candidate capacitors 131-135 in this case) to switch the first through the third candidate capacitors 131-135 to the charging mode. In this way, the first through the third candidate capacitors 131-135 will be respectively charged at the same time, so as to have different cross voltage values.

Accordingly, in a first operation period T1, the capacitor selection circuit 170 may select some candidate capacitors from the first capacitor group to be selected capacitors for coupling to the second gain stage 120, and also switch all candidate capacitors in the second capacitor group (i.e., the fourth through the sixth candidate capacitors 151-155) to the charging mode, so that all candidate capacitors in the second capacitor group can be charged in the first operation period T1.

In a second operation period T2 after the first operation period T1, the capacitor selection circuit 170 would instead select some candidate capacitors from the second capacitor group that has been completely charged to be selected capacitors for coupling to the second gain stage 120, and also switch all candidate capacitors in the first capacitor group (i.e., the first through the third candidate capacitors 131-135) to the charging mode, so that all candidate capacitors in the first capacitor group can be charged in the second operation period T2.

Next, in a third operation period T3 after the second operation period T2, the capacitor selection circuit 170 would instead select some candidate capacitors from the first through the third candidate capacitors 131-135 that have been completely charged to be selected capacitors for coupling to the second gain stage 120, and also switch all of the fourth through the sixth candidate capacitors 151-155 to the charging mode, so that the fourth through the sixth candidate capacitors 151-155 can be charged in the third operation period T3.

In the subsequent operation periods, the capacitor selection circuit 170 may repeatedly conduct the above operations to charge the candidate capacitors on a group basis and select appropriate candidate capacitors from the capacitor group that is already charged to be the selected capacitors.

In practice, the capacitor selection circuit 170 may select some candidate capacitors, which can reduce the required charging time or discharging time after being coupled to the second gain stage 120, from the precharged capacitor group to be selected capacitors in each of the above operation periods, and control related switches so that only the selected capacitors can be coupled to the second gain stage 120, but the other candidate capacitors in the first through the sixth candidate capacitors 131-135 and 151-155 will not be coupled to the second gain stage 120.

Figure 2:
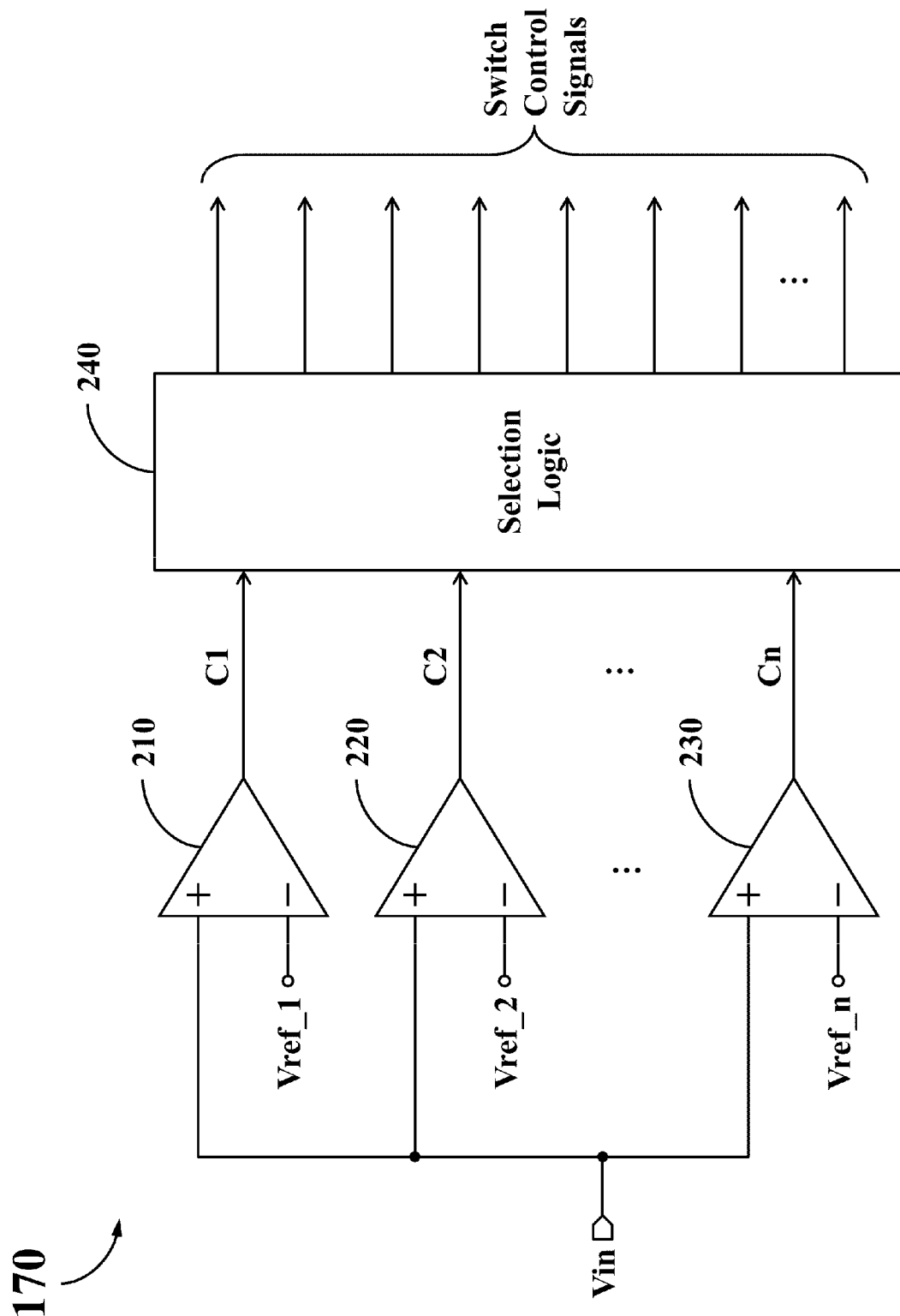
FIG. 2 shows a simplified schematic diagram of a capacitor selection circuit in FIG. 1 according to one embodiment of the present disclosure.

For example, FIG. 2 shows a simplified schematic diagram of the capacitor selection circuit 170 according to one embodiment of the present disclosure. In the embodiment of FIG. 2, the capacitor selection circuit 170 comprises multiple comparators (e.g., the exemplary comparators 210, 220, and 230 shown in FIG. 2), and a selection logic 240.

In the capacitor selection circuit 170, each comparator is arranged to operably compare the input signal Vin of the prior stage circuit 102 with a corresponding reference signal. For example, the first comparator 210 is arranged to operably compare the input signal Vin with the first reference signal Vref_1 to generate a first comparison signal C1. The second comparator 220 is arranged to operably compare the input signal Vin with the second reference signal Vref_2 to generate a second comparison signal C2. The third comparator 230 is arranged to operably compare the input signal Vin with the third reference signal Vref_n to generate a third comparison signal Cn; and so forth. In one embodiment, the signal value of the third reference signal Vref_n is greater than the signal value of the second reference signal Vref_2, and the signal value of the second reference signal Vref_2 is greater than the signal value of the first reference signal Vref_1.

The selection logic 240 is coupled with the aforementioned multiple comparators 210-230, and arranged to operably select some candidate capacitors having appropriate cross voltage values from the precharged capacitor group to be selected capacitors according to the comparison results of the comparators 210-230. In addition, the selection logic 240 is further arranged to operably generate multiple control signals for controlling the first through the sixth switches 141-146 to configure the coupling relationships of all candidate capacitors, so that only the selected capacitors can be coupled to the second gain stage 120 at the same time while the other candidate capacitors in the first through the sixth candidate capacitors 131-135 and 151-155 cannot be coupled to the second gain stage 120. In other words, only the selected capacitors can be employed to participate in the generation operation of next output signal Vout conducted by the second gain stage 120, and the other candidate capacitors will not participate in the generation operation of next output signal Vout.

As long as the signal values of the multiple reference signals Vref_1-Vref_n are properly configured, the selection logic 240 is able to identify an estimated range of the signal value of the input signal Vin based on the multiple comparison signals C1-Cn outputted from the comparators 210-230.

For example, if the first comparison signal C1 shows that the signal value of the input signal Vin is greater than the signal value of the first reference signal Vref_1, the second comparison signal C2 shows that the signal value of the input signal Vin is less than the signal value of the second reference signal Vref_2, while the third comparison signal Cn shows that the signal value of the input signal Vin is less than the signal value of the third reference signal Vref_n, the selection logic 240 can accordingly determine that the magnitude of the input signal Vin is between the magnitude of the first reference signal Vref_1 and the magnitude of the second reference signal Vref_2.

For another example, if the first comparison signal C1 shows that the signal value of the input signal Vin is greater than the signal value of the first reference signal Vref_1, the second comparison signal C2 shows that the signal value of the input signal Vin is greater than the signal value of the second reference signal Vref_2, while the third comparison signal Cn shows that the signal value of the input signal Vin is less than the signal value of the third reference signal Vref_n, the selection logic 240 can accordingly determine that the magnitude of the input signal Vin is between the magnitude of the second reference signal Vref_2 and the magnitude the third reference signal Vref_n.

Since the magnitudes of the first voltage V1, the second voltage V2, the third voltage V3, and the first predetermined voltage Vcm are given values in circuitry design, the cross voltage values of respective candidate capacitors after they are precharged are also given values.

As described previously, the relationship between the magnitude of the input signal Vin and the magnitude of the output signal Vout is determined by the gain of the first gain stage 110 and the gain of the second gain stage 120. Therefore, the mapping relationship between the magnitude of the input signal Vin and the most suitable cross voltage value of the candidate capacitor can be derived based on the matching relationship between the ideal magnitude of the output signal Vout and the most suitable cross voltage value of the candidate capacitor in circuitry design stage. In practice, the selection logic 240 may be realized with various combinations of logic gates, and the practical implementations of the selection logic 240 may be based on the mapping relationship between the magnitude of the input signal Vin and the most suitable cross voltage value of the candidate capacitor. In this way, the selection logic 240 is enabled to select the capacitor having most suitable cross voltage value from the multiple candidate capacitors to be the selected capacitor, so as to reduce the required time for charging or discharging after the selected capacitor is coupled to the second gain stage 120.

For example, in one embodiment, the selection logic 240 may be designed to operably select the candidate capacitor whose cross voltage is close to the voltage difference between the first voltage V1 and the first predetermined voltage Vcm to be a selected capacitor if the magnitude of the input signal Vin is less than that of the first reference signal Vref_1; to operably select the candidate capacitor whose cross voltage is close to the voltage difference between the second voltage V2 and the first predetermined voltage Vcm to be a selected capacitor if the magnitude of the input signal Vin is between the magnitude of the first reference signal Vref_1 and the magnitude of the second reference signal Vref_2; and to operably select the candidate capacitor whose cross voltage is close to the voltage difference between the third voltage V3 and the first predetermined voltage Vcm to be a selected capacitor if the magnitude of the input signal Vin is between the magnitude of the second reference signal Vref_2 and the magnitude of the third reference signal Vref_n.

For another example, in another embodiment, the selection logic 240 may be designed to operably select the candidate capacitor whose cross voltage is close to the voltage difference between the first voltage V1 and the first predetermined voltage Vcm to be a selected capacitor if the magnitude of the input signal Vin is between the magnitude of the first reference signal Vref_1 and the magnitude of the second reference signal Vref_2; to operably select the candidate capacitor whose cross voltage is close to the voltage difference between the second voltage V2 and the first predetermined voltage Vcm to be a selected capacitor if the magnitude of the input signal Vin is between the magnitude of the second reference signal Vref_2 and the magnitude of the third reference signal Vref_n; and to operably select the candidate capacitor whose cross voltage is close to the voltage difference between the third voltage V3 and the first predetermined voltage Vcm to be a selected capacitor if the magnitude of the input signal Vin is greater than the magnitude of the third reference signal Vref_n.

As described previously, the first capacitor group and the second capacitor group would be charged by turns. In each operation period, the selection logic 240 may select the candidate capacitor having most suitable cross voltage value from the precharged capacitor group to be the selected capacitor for coupling to the second gain stage 120 according to the aforementioned selection principles.

For example, in the aforementioned first operation period T1, the selection logic 240 may, based on the comparison results of the comparators 210-230 at that time, select some candidate capacitors that will require less time for charging or discharging from the first capacitor group (i.e., the first through the third candidate capacitors 131-135 in this case) as the selected capacitors to be coupled to the second gain stage 120. Additionally, the selection logic 240 may generate multiple control signals for controlling the first through the sixth switches 141-146 to couple the selected capacitor to the second gain stage 120. In the first operation period T1, the selection logic 240 may also generate multiple control signals for controlling the seventh through the twelfth switches 161-166 to switch all of the candidate capacitors in the second capacitor group (i.e., the fourth through the sixth candidate capacitors 151-155 in this case) to the charging mode, and not to couple to the second gain stage 120.

In the subsequent second operation period T2, the selection logic 240 may, based on the comparison results of the comparators 210-230 at that time, select some candidate capacitors that will require less time for charging or discharging from the second capacitor group as the selected capacitors to be coupled to the second gain stage 120. Additionally, the selection logic 240 may generate multiple control signals for controlling the seventh through the twelfth switches 161-166 to couple the selected capacitor to the second gain stage 120. In the second operation period T2, the selection logic 240 may also generate multiple control signals for controlling the first through the sixth switches 141-146 to switch all of the candidate capacitors in the first capacitor group to the charging mode, and not to couple to the second gain stage 120.

In subsequent operation period, the selection logic 240 may re-select suitable candidate capacitor from the precharged capacitor group to be selected capacitor based on the comparison results of the comparators 210-230 at that time.

Accordingly, before the capacitor selection circuit 170 selects suitable candidate capacitor to be coupled to the second gain stage 120 from the first capacitor group (i.e., the first through the third candidate capacitors 131-135 in this case), the first through the third candidate capacitors 131-135 would have been respectively precharged to have different cross voltage values in advance. Similarly, before the capacitor selection circuit 170 selects suitable candidate capacitor to be coupled to the second gain stage 120 from the second capacitor group (i.e., the fourth through the sixth candidate capacitors 151-155 in this case), the fourth through the sixth candidate capacitors 151-155 would have been respectively precharged to have different cross voltage values in advance.

It can be appreciated from the foregoing elaborations that the selected capacitor to be coupled to the second gain stage 120 by the capacitor selection circuit 170 would have been precharged to have a suitable cross voltage value. Therefore, the required time for charging or discharging the selected capacitor after it is coupled to the second gain stage 120 can be significantly reduced. As a result, the response speed of the operational amplifier 100 can be effectively increased, thereby improving the overall performance or operating speed of the circuit using the disclosed operational amplifier 100.

In addition, by adopting the mechanism of charging the multiple candidate capacitors 131-135 and 151-155 by turns on a group basis and the mechanism of selecting feedback capacitors to be coupled to the second gain stage 120 only from precharged capacitor group described previously, the required time for charging or discharging the selected capacitor after the selected capacitor is coupled to the second gain stage 120 can be further reduced, so that the response speed of the operational amplifier 100 can be further increased, thereby further increasing the overall performance or operating speed of the circuit using the disclosed operational amplifier 100.

In practical application, the disclosed operational amplifier 100 may cooperate with two different circuits by turns, so that the same operational amplifier 100 can be shared by two different circuits, thereby reducing the required circuit area.

For example, the operational amplifier 100 may be applied in various pipelined analog-to-digital converter (pipelined ADC) and shared by two different circuit stages thereof.

Figure 3:
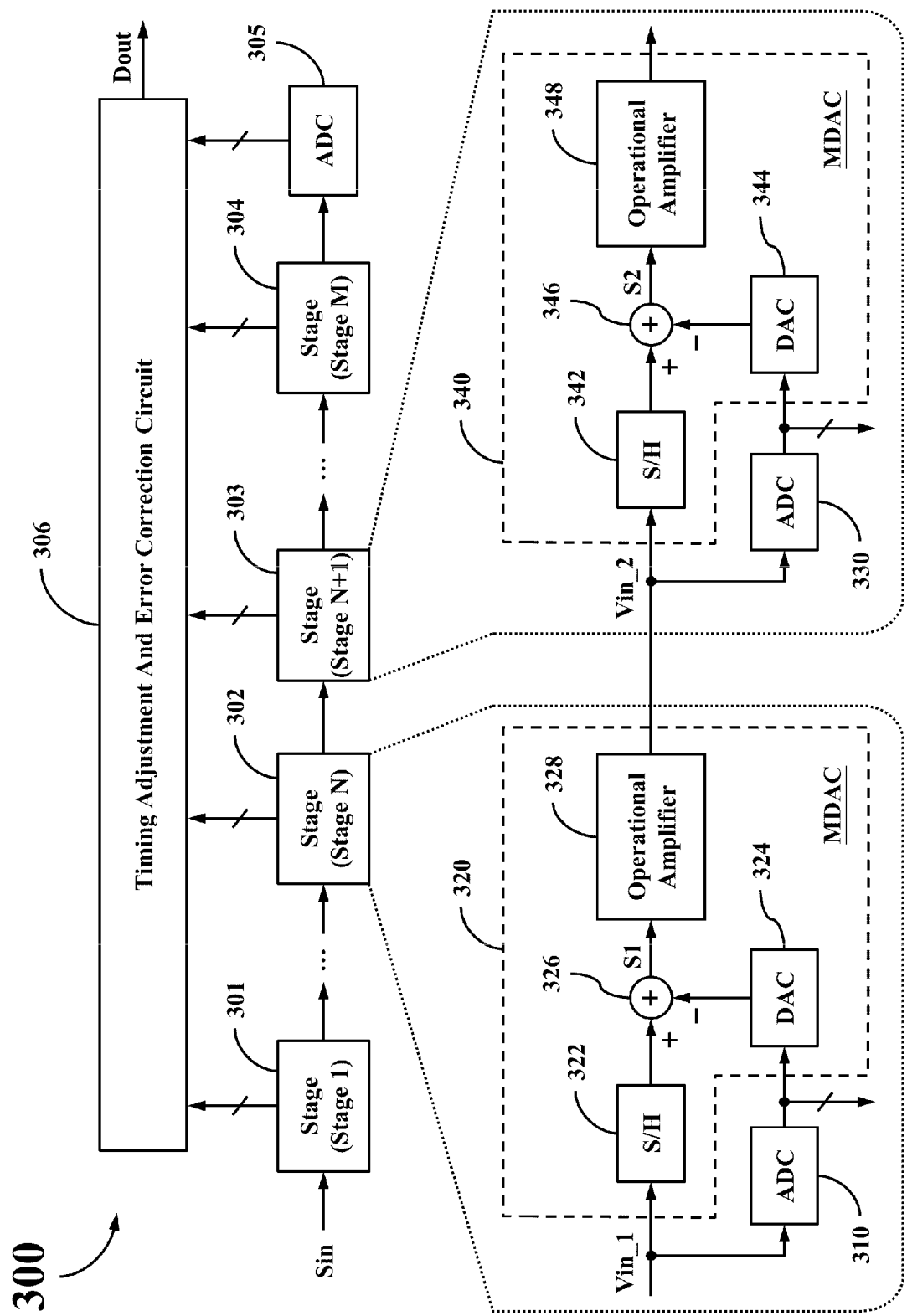
FIG. 3 shows a simplified functional block diagram of a pipelined analog-to-digital converter according to a first embodiment of the present disclosure.
Figure 4:
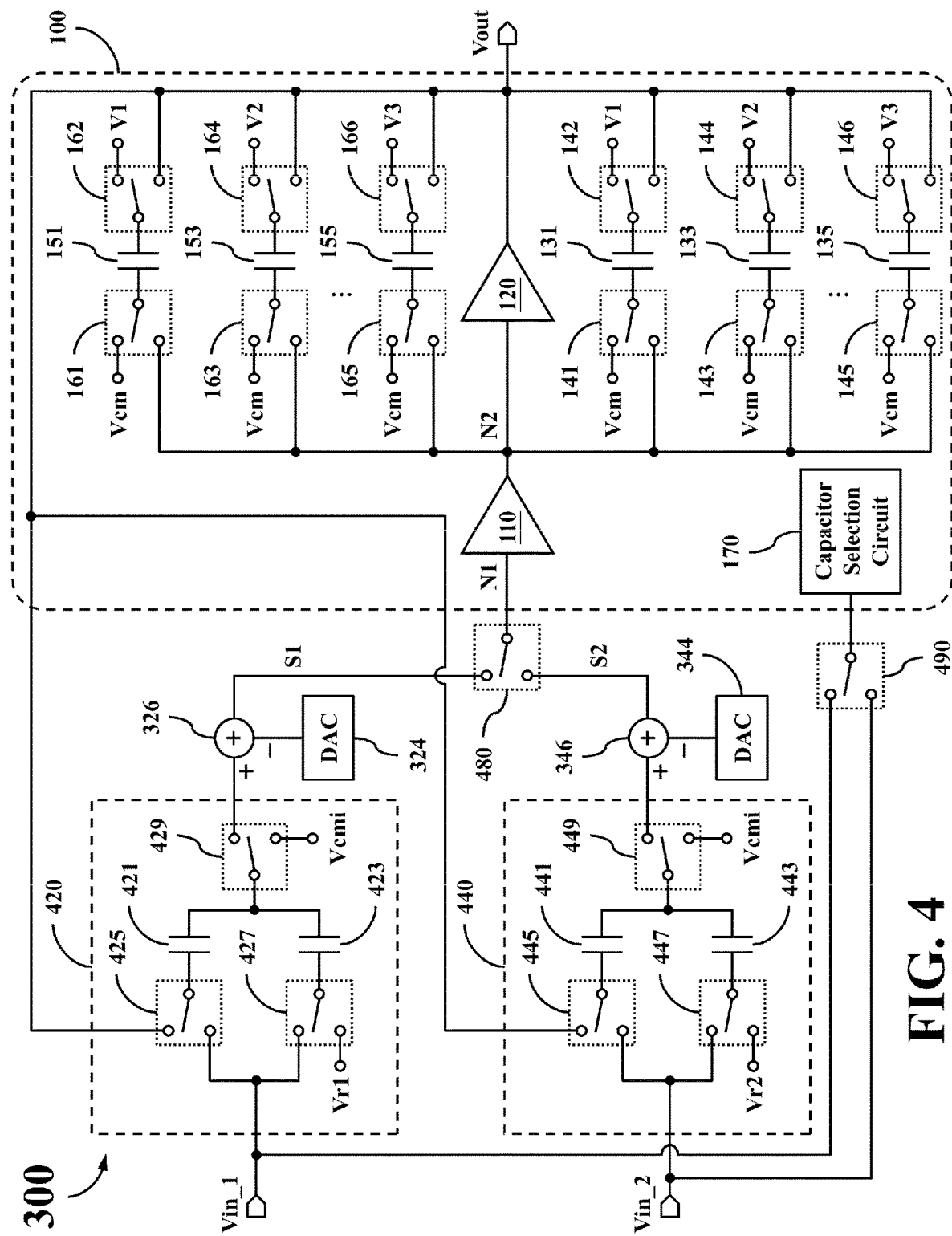
FIG. 4 shows a portion of the simplified functional block diagram of the pipelined analog-to-digital converter of FIG. 3 according to one embodiment of the present disclosure.

Please refer to FIG. 3, which shows a simplified functional block diagram of a pipelined analog-to-digital converter 300 according to a first embodiment of the present disclosure. FIG. 4 shows a portion of the simplified functional block diagram of the pipelined analog-to-digital converter 300 according to one embodiment of the present disclosure.

The pipelined analog-to-digital converter 300 is utilized for converting an analog input signal Sin into a digital output signal Dout, and comprises multiple successive circuit stages (e.g., the exemplary stages 301-304 shown in FIG. 3), a back-end ADC 305, and a timing adjustment and error correction circuit 306. In the embodiment of FIG. 3, the pipelined analog-to-digital converter 300 is a single-channel pipelined analog-to-digital converter.

The stages 301-304 in the pipelined analog-to-digital converter 300 have similar circuitry structure. For the purpose of explanatory convenience in the following, the stage 302 of stage N and the stage 303 of stage N+1 are used as examples for descriptions.

As shown in FIG. 3, the stage 302 comprises a first ADC 310 and a first multiplying digital-to-analog converter (MDAC) 320. The first ADC 310 is arranged to operably conduct an analog-to-digital conversion on the input signal of the stage 302 (hereinafter, the first input signal Vin_1). The first MDAC 320 is arranged to operably conduct a digital-to-analog conversion on the first input signal Vin_1 according to a digital value generated by the first ADC 310 to generate and transmit an analog signal Vin_2 to the next stage 303.

The first MDAC 320 comprises a first sample-and-hold circuit 322, a first digital-to-analog converter (DAC) 324, a first subtractor 326, and a first operational amplifier 328.

In the first sample-and-hold circuit 322 is arranged to operably conduct a sample-and-hold operation on the first input signal Vin_1. The first DAC 324 is arranged to operably conduct a digital-to-analog conversion on the digital value generated by the first ADC 310 to generate a first analog signal corresponding to the first input signal Vin_1. The first subtractor 326 is arranged to operably process the output of the first sample-and-hold circuit 322 and the output of the first DAC 324 to form a first subtracted signal S1. The first operational amplifier 328 is arranged to operably amplify the first subtracted signal S1 to generate an analog signal Vin_2.

Similarly, the stage 303 comprises a second ADC 330 and a second MDAC 340. The second ADC 330 is arranged to operably conduct an analog-to-digital conversion on the input signal of the stage 303 (i.e., the analog signal Vin_2; hereinafter, the second input signal Vin_2). The second MDAC 340 is arranged to operably conduct a digital-to-analog conversion on the second input signal Vin_2 according to a digital value generated by the second ADC 330 to generate and transmit an analog signal to the next stage.

The second MDAC 340 comprises a second sample-and-hold circuit 342, a second DAC 344, a second subtractor 346, and a second operational amplifier 348.

The second sample-and-hold circuit 342 is arranged to operably conduct a sample-and-hold operation on the second input signal Vin_2. The second DAC 344 is arranged to operably conduct a digital-to-analog conversion on a digital value generated by the second ADC 330 to generate a second analog signal corresponding to the second input signal Vin_2. The second subtractor 346 is arranged to operably process the output of the second sample-and-hold circuit 342 and the output of the second DAC 344 to form a second subtracted signal S2. The second operational amplifier 348 is arranged to operably amplify the second subtracted signal S2 to generate an analog signal to be passed to the next stage.

The circuit structure and operations of the other stages 301 and 304 in the pipelined analog-to-digital converter 300 are similar with the aforementioned stages 302 and 303. Accordingly, the foregoing descriptions regarding the circuit structure of the stages 302 and 303 are also applicable to the stages 301 and 304.

The digital value generated by each stage will be transmitted to the timing adjustment and error correction circuit 306. In addition, the back-end ADC 305 would convert the analog signal transmitted from the previous stage 304 into a digital value and transmit the resulting digital value to the timing adjustment and error correction circuit 306.

Based on those digital values transmitted from all stages and the back-end ADC 305, the timing adjustment and error correction circuit 306 performs a timing adjustment and error correction operation to generate the digital output signal Dout corresponding to the analog input signal Sin.

It can be appreciated from the foregoing descriptions that each stage in the pipelined analog-to-digital converter 300 needs to utilize an operational amplifier to amplify related signals.

In operations, the operational amplifier in each stage does not perform the signal amplification operation all the time. For example, when the first operational amplifier 328 in the stage 302 (stage N) performs signal amplification operation, the second operational amplifier 348 in the stage 303 (stage N+1) does not require to perform signal amplification operation because the second sample-and-hold circuit 342 is conducting the sampling operation at that time. For another example, when the second operational amplifier 348 in the stage 303 (stage N+1) performs signal amplification operation, the first operational amplifier 328 in the stage 302 (stage N) does not require to perform signal amplification operation because the first sample-and-hold circuit 322 is conducting the sampling operation at that time.

Therefore, in the pipelined analog-to-digital converter 300, a single operational amplifier 100 described previously can be shared by an odd stage and an even stage.

For example, FIG. 4 shows a portion of the simplified functional block diagram of the pipelined analog-to-digital converter 300 according to one embodiment of the present disclosure.

The first switched capacitor network 420 in FIG. 4 is arranged to operably conduct a sample-and-hold operation on the aforementioned first input signal Vin_1, and can be employed to realize the functionalities of the first sample-and-hold circuit 322 in the aforementioned stage 302. The second switched capacitor network 440 in FIG. 4 is arranged to operably conduct a sample-and-hold operation on the aforementioned second input signal Vin_2, and can be employed to realize the functionalities of the second sample-and-hold circuit 342 in the aforementioned stage 303.

In the embodiment of FIG. 4, the first switched capacitor network 420 comprises a first capacitor 421, a second capacitor 423, a thirteenth switch 425, a fourteenth switch 427, and a fifteenth switch 429. The second switched capacitor network 440 comprises a third capacitor 441, a fourth capacitor 443, a sixteenth switch 445, a seventeenth switch 447, and an eighteenth switch 449. The switching operations of the thirteenth switch 425, the fourteenth switch 427, the fifteenth switch 429, the sixteenth switch 445, the seventeenth switch 447, and the eighteenth switch 449 may be controlled by the timing adjustment and error correction circuit 306 or other timing control circuit (not shown) in the pipelined analog-to-digital converter 300.

In the first switched capacitor network 420, the thirteenth switch 425 is coupled with a first terminal of the first capacitor 421, and arranged to selectively couple the first capacitor 421 to the input signal of the stage 302 (e.g., the first input signal Vin_1 in this case) or the output signal Vout of the operational amplifier 100. The fourteenth switch 427 is coupled with a first terminal of the second capacitor 423, and arranged to selectively couple the second capacitor 423 to the first input signal Vin_1 or a predetermined voltage Vr1. The fifteenth switch 429 is coupled with a second terminal of the first capacitor 421 and a second terminal of the second capacitor 423, and arranged to selectively couple the first capacitor 421 and the second capacitor 423 to the first subtractor 326 or another predetermined voltage Vcmi. In practice, the predetermined voltage Vr1 may be a fixed voltage or the common mode voltage of the first DAC 324, while the predetermined voltage Vcmi may be a fixed voltage or the common mode voltage of the first switched capacitor network 420.

In the second switched capacitor network 440, the sixteenth switch 445 is coupled with a first terminal of the third capacitor 441, and arranged to selectively couple the third capacitor 441 to the input signal of the stage 303 (e.g., the second input signal Vin_2 in this case) or the output signal Vout of the operational amplifier 100. The seventeenth switch 447 is coupled with a first terminal of the fourth capacitor 443, and arranged to selectively couple the fourth capacitor 443 to the second input signal Vin_2 or a predetermined voltage Vr2. The eighteenth switch 449 is coupled with a second terminal of the third capacitor 441 and a second terminal of the fourth capacitor 443, and arranged to selectively couple the third capacitor 441 and the fourth capacitor 443 to the second subtractor 346 or the predetermined voltage Vcmi. In practice, the predetermined voltage Vr2 may be a fixed voltage or the common mode voltage of the second DAC 344.

In practice, each of the switches 425, 427, 429, 445, 447, and 449 may be realized with a suitable combination of multiple transistors, or may be realized with a suitable combination of multiple transistors and suitable logic gates.

The operations of the functional blocks 324, 326, 344, and 346 in FIG. 4 are respectively the same as the corresponding functional blocks in FIG. 3.

Please note that in the pipelined analog-to-digital converter 300 of FIG. 4, the functionalities of both the first operational amplifier 328 and the second operational amplifier 348 of FIG. 3 are realized with the same operational amplifier 100. Specifically, the operational amplifier 100 plays the roles of the first operational amplifier 328 and the second operational amplifier 348 of FIG. 3 in different operation periods.

For example, when the operational amplifier 100 in FIG. 4 is employed to realize the functionalities of the first operational amplifier 328 in FIG. 3, the operational amplifier 100 may utilize the first subtracted signal S1 to be the first signal N1, and also utilize the first input signal Vin_1 to be the input signal Vin. Similarly, when the operational amplifier 100 in FIG. 4 is employed to realize the functionalities of the second operational amplifier 348 in FIG. 3, the operational amplifier 100 may utilize the second subtracted signal S2 to be the first signal N1, and also utilize the second input signal Vin_2 to be the input signal Vin.

In one embodiment, as shown in FIG. 4, the pipelined analog-to-digital converter 300 may comprise an output switch 480 coupled with the first subtractor 326, the second subtractor 346, and the first gain stage 110, and further comprise an input switch 490 coupled with the capacitor selection circuit 170. The output switch 480 is arranged to selectively output the first subtracted signal S1 or the second subtracted signal S2 to the first gain stage 110 to be the aforementioned first signal N1. The input switch 490 is arranged to selectively output the first input signal Vin_1 or the second input signal Vin_2 to the capacitor selection circuit 170 to be the aforementioned input signal Vin.

Like the embodiment of FIG. 1, the operational amplifier 100 generates the output signal Vout according to the first signal N1, and switches the coupling relationships of the multiple candidate capacitors 131-135 and 151-155 based on the magnitude of the input signal Vin, so that only part of the multiple candidate capacitors 131-135 and 151-155 can be employed to participate in the generation of the output signal Vout at the same time.

In operations, the operational amplifier 100 may play the roles of the first operational amplifier 328 and the second operational amplifier 348 of FIG. 3 by turns. For example, the operational amplifier 100 may play the role of the first operational amplifier 328 of FIG. 3 in a specific operation period (e.g., the first operation period T1 described above) during which the stage 302 requires to amplify the first subtracted signal S1. Afterwards, in the next operation period (e.g., the second operation period T2 described above) during which the stage 303 requires to amplify the second subtracted signal S2, the operational amplifier 100 may instead play the role of the second operational amplifier 348 of FIG. 3.

In the aforementioned first operation period T1 during which the operational amplifier 100 requires to amplify the first subtracted signal S1 in the stage 302, the timing adjustment and error correction circuit 306 (or other timing control circuit) may control the thirteenth switch 425 to couple the first terminal of the first capacitor 421 to the output signal Vout of the operational amplifier 100; synchronously control the fourteenth switch 427 to couple the first terminal of the second capacitor 423 to the predetermined voltage Vr1; and synchronously control the fifteenth switch 429 to couple both the second terminal of the first capacitor 421 and the second terminal of the second capacitor 423 to the first subtractor 326. In the first operation period T1, the timing adjustment and error correction circuit 306 (or other timing control circuit) may control the sixteenth switch 445 to couple the first terminal of the third capacitor 441 to the second input signal Vin_2; synchronously control the seventeenth switch 447 to couple the first terminal of the fourth capacitor 443 to the second input signal Vin_2; and synchronously control the eighteenth switch 449 to couple both the second terminal of the third capacitor 441 and the second terminal of the fourth capacitor 443 to the predetermined voltage Vcmi. In this situation, the timing adjustment and error correction circuit 306 (or other timing control circuit) may control the output switch 480 to output the first subtracted signal S1 to the first gain stage 110, and also control the input switch 490 to output the first input signal Vin_1 to the capacitor selection circuit 170.

Afterwards, in the aforementioned second operation period T2 during which the operational amplifier 100 requires to amplify the second subtracted signal S2 in the stage 303, the timing adjustment and error correction circuit 306 (or other timing control circuit) may control the thirteenth switch 425 to couple the first terminal of the first capacitor 421 to the first input signal Vin_1; synchronously control the fourteenth switch 427 to couple the first terminal of the second capacitor 423 to the first input signal Vin_1; and synchronously control the fifteenth switch 429 to couple both the second terminal of the first capacitor 421 and the second terminal of the second capacitor 423 to the predetermined voltage Vcmi. In the second operation period T2, the timing adjustment and error correction circuit 306 (or other timing control circuit) may control the sixteenth switch 445 to couple the first terminal of the third capacitor 441 to the output signal Vout of the operational amplifier 100; synchronously control the seventeenth switch 447 to couple the first terminal of the fourth capacitor 443 to the predetermined voltage Vr2; and synchronously control the eighteenth switch 449 to couple both the second terminal of the third capacitor 441 and the second terminal of the fourth capacitor 443 to the second subtractor 346. In this situation, the timing adjustment and error correction circuit 306 (or other timing control circuit) may control the output switch 480 to output the second subtracted signal S2 to the first gain stage 110, and also control the input switch 490 to output the second input signal Vin_2 to the capacitor selection circuit 170.

As a result, the operational amplifier 100 only amplifies the first subtracted signal S1 in the stage 302 in the first operation period T1, and only amplifies the second subtracted signal S2 in the stage 303 in the second operation period T2.

As long as the timing adjustment and error correction circuit 306 (or other timing control circuit) properly configures the switching timing of the switches 425, 427, 429, 445, 447, 449, 480, and 490, the operational amplifier 100 is enabled to cooperate with other circuits in different stages of the pipelined analog-to-digital converter 300 by turns, so that different stages are enabled to share the same operational amplifier 100.

It can be appreciated from the foregoing descriptions that the combination of the functional blocks 420, 440, 324, 326, 344, and 346 of FIG. 4 can be regarded as one embodiment of the aforementioned prior stage circuit 102 in FIG. 1.

The selected capacitor to be coupled to the second gain stage 120 in each operation period would have been precharged to have a suitable cross voltage value. Therefore, the required time for charging or discharging the selected capacitor after it is coupled to the second gain stage 120 can be significantly reduced. As a result, the response speed of the operational amplifier 100 can be effectively increased, thereby improving the overall performance or operating speed of the pipelined analog-to-digital converter 300.

In addition, by adopting the mechanism of charging the multiple candidate capacitors 131-135 and 151-155 by turns on a group basis and the mechanism of selecting feedback capacitors to be coupled to the second gain stage 120 only from precharged capacitor group described previously, the required time for charging or discharging the selected capacitor after the selected capacitor is coupled to the second gain stage 120 can be further reduced, so that the response speed of the operational amplifier 100 can be further increased, thereby further increasing the overall performance or operating speed of the pipelined analog-to-digital converter 300.

The foregoing descriptions regarding the connections, implementations, operations, and related advantages of the operational amplifier 100 of FIG. 1 are also applicable to the embodiment of FIG. 4. For the sake of brevity, those descriptions will not be repeated here.

Since the operational amplifier 100 can cooperate with other circuit components in two different stages 302 and 303, the stages 302 and 303 can share a single shared operational amplifier 100 in operations. As a result, the quantity of operational amplifiers required by the pipelined analog-to-digital converter 300 can be significantly reduced, thereby reducing the overall circuit area of the pipelined analog-to-digital converter 300.

Please note that in the previous embodiment, the stages 302 and 303 sharing the same operational amplifier 100 are successive stages in the same channel. But this is merely an exemplary example, rather than a restriction to the practical implementations. In practice, the two stages sharing the same operational amplifier 100 are not limited to be successive stages.

Figure 5:
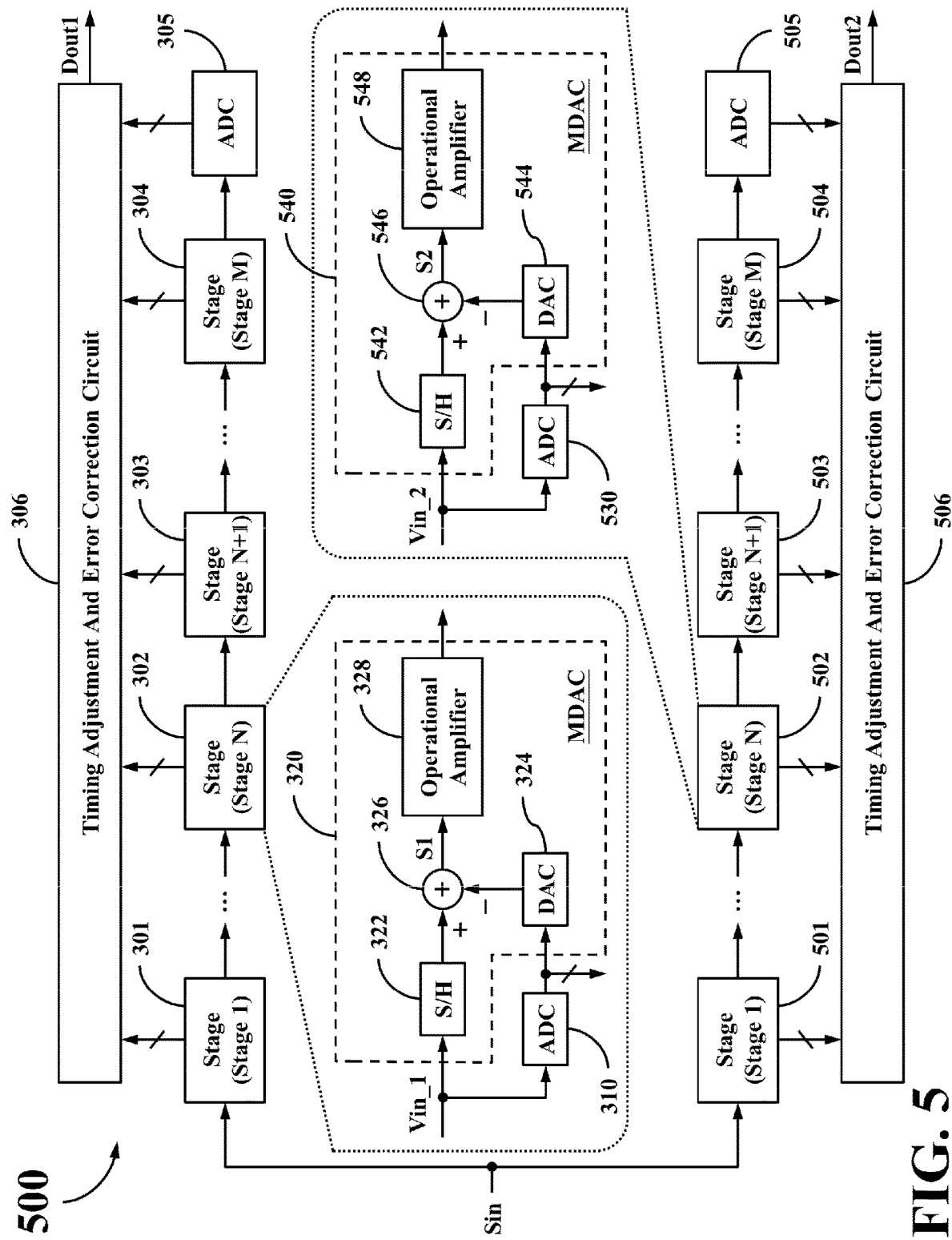
FIG. 5 shows a simplified functional block diagram of a pipelined analog-to-digital converter according to a second embodiment of the present disclosure.
Figure 6:
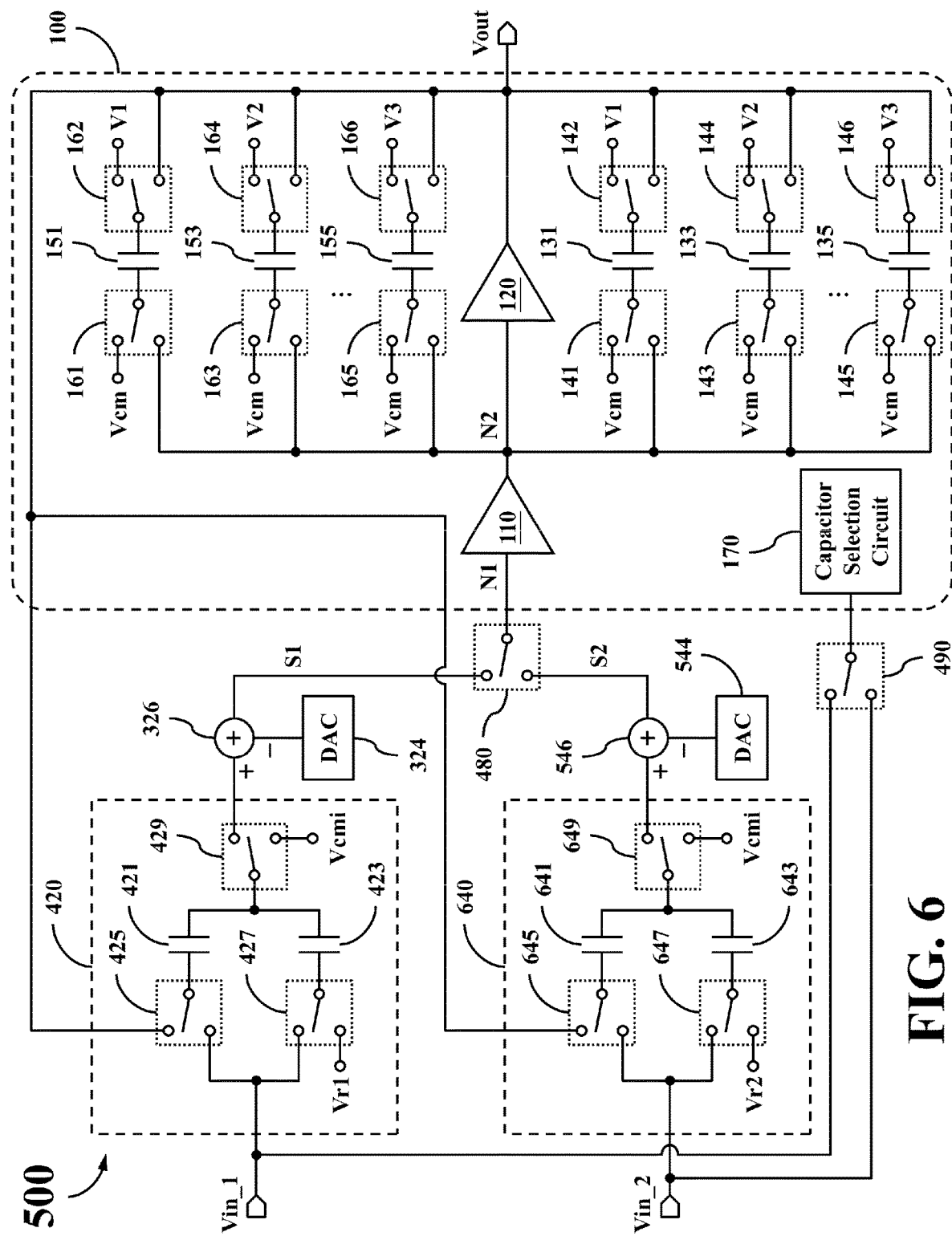
FIG. 6 shows a portion of the simplified functional block diagram of the pipelined analog-to-digital converter of FIG. 5 according to one embodiment of the present disclosure.

Please refer to FIG. 5, which shows a simplified functional block diagram of a pipelined analog-to-digital converter 500 according to a second embodiment of the present disclosure. FIG. 6 shows a portion of the simplified functional block diagram of the pipelined analog-to-digital converter 500 according to one embodiment of the present disclosure.

The pipelined analog-to-digital converter 500 is a dual-channel ADC, and utilized for converting the analog input signal Sin into two digital output signals Dout1 and Dout2.

In addition to the multiple stages 301-304, the back-end ADC 305, and the timing adjustment and error correction circuit 306 corresponding to one channel, the pipelined analog-to-digital converter 500 further comprises multiple stages (e.g., the exemplary stages 501-504 shown in FIG. 5), a back-end ADC 505, and a timing adjustment and error correction circuit 506 corresponding to another channel.

The two channels of the pipelined analog-to-digital converter 500 have the same circuit structure, but the circuits in the two channels operate at different timings. The stages 301-304 and 501-504 in the pipelined analog-to-digital converter 500 have the same circuit structure and operations as the aforementioned the stages 302 and 303. For example, stage N in the second channel (i.e., the stage 502) comprises a second ADC 530 and a second MDAC 540. The second ADC 530 is arranged to operably conduct an analog-to-digital conversion on the input signal of the stage 502 (hereinafter, the second input signal Vin_2). The second MDAC 540 is arranged to operably conduct a digital-to-analog conversion on the second input signal Vin_2 according to a digital value generated by the second ADC 530 to generate and transmit an analog signal to the next stage.

Like the aforementioned second MDAC 340, the second MDAC 540 comprises a second sample-and-hold circuit 542, a second DAC 544, a second subtractor 546, and a second operational amplifier 548. The second sample-and-hold circuit 542 is arranged to operably conduct a sample-and-hold operation on the second input signal Vin_2. The second DAC 544 is arranged to operably conduct a digital-to-analog conversion on the digital value generated by the second ADC 530 to generate a second analog signal. The second subtractor 546 is arranged to operably process the output of the second sample-and-hold circuit 542 and the output of the second DAC 544 to form a second subtracted signal S2. The second operational amplifier 548 is arranged to operably amplify the second subtracted signal S2 to generate an analog signal to be transmitted to the next stage.

The foregoing descriptions regarding the circuit structure of the stages 302 and 303 are also applicable to the stages 301-304 and 501-504 in FIG. 5.

Like the embodiment of FIG. 3 described above, each stage in the pipelined analog-to-digital converter 500 needs to utilize an operational amplifier to amplify related signals, but the operational amplifier in each stage does not require performing signal amplification operations all the time.

For example, when the first operational amplifier 328 in stage N of the first channel (i.e., the stage 302) performs signal amplification operation, the second operational amplifier 548 in stage N of the second channel (i.e., the stage 502) does not require to perform signal amplification operation because the second sample-and-hold circuit 542 is conducting the sampling operation at that time. For another example, when the second operational amplifier 548 in the stage 502 performs signal amplification operation, the first operational amplifier 328 in the stage 302 does not require to perform signal amplification operation because the first sample-and-hold circuit 322 is conducting the sampling operation at that time.

Therefore, in the pipelined analog-to-digital converter 500, a single operational amplifier 100 described previously can be shared by an odd stage in the first channel and another odd stage in the second channel. Similarly, a single operational amplifier 100 can be shared by an even stage in the first channel and another even stage in the second channel.

For example, FIG. 6 shows a portion of the simplified functional block diagram of the pipelined analog-to-digital converter 500 according to one embodiment of the present disclosure.

The second switched capacitor network 640 in FIG. 6 is arranged to operably conduct a sample-and-hold operation on the second input signal Vin_2, and can be employed to realize the functionalities of the second sample-and-hold circuit 542 in the aforementioned stage 502.

In the second switched capacitor network 640, the sixteenth switch 645 is coupled with a first terminal of the third capacitor 641, and arranged to selectively couple the third capacitor 641 to the input signal of the stage 502 (i.e., the second input signal Vin_2 in this case) or the output signal Vout of the operational amplifier 100. The seventeenth switch 647 is coupled with a first terminal of the fourth capacitor 643, and arranged to selectively couple the fourth capacitor 643 to the second input signal Vin_2 or the predetermined voltage Vr2. The eighteenth switch 649 is coupled with a second terminal of the third capacitor 641 and a second terminal of the fourth capacitor 643, and arranged to selectively couple both the third capacitor 641 and the fourth capacitor 643 to the second subtractor 546 or the predetermined voltage Vcmi. The switching operations of the sixteenth switch 645, the seventeenth switch 647, and the eighteenth switch 649 may be controlled by the timing adjustment and error correction circuit 506 or other timing control circuit (not shown) in the pipelined analog-to-digital converter 500. In practice, the predetermined voltage Vr2 is a fixed voltage or the common mode voltage of the second DAC 544.

In practice, each of the switches 645, 647, and 649 may be realized with a suitable combination of multiple transistors, or may be realized with a suitable combination of multiple transistors and suitable logic gates.

Please note that in the pipelined analog-to-digital converter 500 of FIG. 6, the functionalities of the first operational amplifier 328 and the second operational amplifier 548 of FIG. 5 are realized with the same operational amplifier 100. Specifically, the operational amplifier 100 plays the roles of the first operational amplifier 328 and the second operational amplifier 548 of FIG. 5 in different operation periods.

For example, when the operational amplifier 100 in FIG. 6 is employed to realize the functionalities of the first operational amplifier 328 in FIG. 5, the operational amplifier 100 may utilize the first subtracted signal S1 to be the first signal N1, and also utilize the first input signal Vin_1 to be the input signal Vin. Similarly, when the operational amplifier 100 in FIG. 6 is employed to realize the functionalities of the second operational amplifier 548 in FIG. 5, the operational amplifier 100 may utilize the second subtracted signal S2 to be the first signal N1, and also utilize the second input signal Vin_2 to be the input signal Vin.

Similar with the embodiment of FIG. 4, the output switch 480 is arranged to selectively output the first subtracted signal S1 or the second subtracted signal S2 to the first gain stage 110 to be the aforementioned first signal N1. The input switch 490 is arranged to selectively output the first input signal Vin_1 or the second input signal Vin_2 to the capacitor selection circuit 170 to be the aforementioned input signal Vin. In this embodiment, when the output switch 480 outputs the first subtracted signal S1 to the first gain stage 110, the input switch 490 would output the first input signal Vin_1 to the capacitor selection circuit 170; and when the output switch 480 outputs the second subtracted signal S2 to the first gain stage 110, the input switch 490 would output the second input signal Vin_2 to the capacitor selection circuit 170.

The structures and operations of the functional blocks 420, 324, 326, 544, and 546 in FIG. 6 are respectively the same as the corresponding functional blocks in FIG. 4.

Like the embodiment of FIG. 1, the operational amplifier 100 generates the output signal Vout according to the first signal N1, and switches the coupling relationships of the multiple candidate capacitors 131-135 and 151-155 based on the magnitude of the input signal Vin, so that only part of the multiple candidate capacitors 131-135 and 151-155 can be employed to participate in the generation of the output signal Vout at the same time.

In operations, the operational amplifier 100 may play the roles of the first operational amplifier 328 and the second operational amplifier 548 of FIG. 5 by turns. For example, the operational amplifier 100 may play the role of the first operational amplifier 328 of FIG. 5 in a specific operation period (e.g., the first operation period T1 described above) during which the stage 302 requires to amplify the first subtracted signal S1. Afterwards, in the next operation period (e.g., the second operation period T2 described above) during which the stage 502 requires to amplify the second subtracted signal S2, the operational amplifier 100 may instead play the role of the second operational amplifier 548 of FIG. 5.

In the aforementioned first operation period T1 during which the operational amplifier 100 requires to amplify the first subtracted signal S1 in the stage 302, the timing adjustment and error correction circuit 306 (or other timing control circuit) may control the thirteenth switch 425 to couple the first terminal of the first capacitor 421 to the output signal Vout of the operational amplifier 100; synchronously control the fourteenth switch 427 to couple the first terminal of the second capacitor 423 to the predetermined voltage Vr1; and synchronously control the fifteenth switch 429 to couple both the second terminal of the first capacitor 421 and the second terminal of the second capacitor 423 to the first subtractor 326. In the first operation period T1, the timing adjustment and error correction circuit 506 (or other timing control circuit) may control the sixteenth switch 645 to couple the first terminal of the third capacitor 641 to the second input signal Vin_2; synchronously control the seventeenth switch 647 to couple the first terminal of the fourth capacitor 643 to the second input signal Vin_2; and synchronously control the eighteenth switch 649 to couple both the second terminal of the third capacitor 641 and the second terminal of the fourth capacitor 643 to the predetermined voltage Vcmi. In this situation, the timing adjustment and error correction circuit 306, 506, or other timing control circuit may control the output switch 480 to output the first subtracted signal S1 to the first gain stage 110, and also control the input switch 490 to output the first input signal Vin_1 to the capacitor selection circuit 170.

Afterwards, in the aforementioned second operation period T2 during which the operational amplifier 100 requires to amplify the second subtracted signal S2 in the stage 502, the timing adjustment and error correction circuit 306 (or other timing control circuit) may control the thirteenth switch 425 to couple the first terminal of the first capacitor 421 to the first input signal Vin_1; synchronously control the fourteenth switch 427 to couple the first terminal of the second capacitor 423 to the first input signal Vin_1; and synchronously control the fifteenth switch 429 to couple both the second terminal of the first capacitor 421 and the second terminal of the second capacitor 423 to the predetermined voltage Vcmi. In the second operation period T2, the timing adjustment and error correction circuit 506 (or other timing control circuit) may control the sixteenth switch 645 to couple the first terminal of the third capacitor 641 to the output signal Vout of the operational amplifier 100; synchronously control the seventeenth switch 647 to couple the first terminal of the fourth capacitor 643 to the predetermined voltage Vr2; and synchronously control the eighteenth switch 649 to couple both the second terminal of the third capacitor 641 and the second terminal of the fourth capacitor 643 to the second subtractor 546. In this situation, the timing adjustment and error correction circuit 306, 506, or other timing control circuit may control the output switch 480 to output the second subtracted signal S2 to the first gain stage 110, and also control the input switch 490 to output the second input signal Vin_2 to the capacitor selection circuit 170.

As a result, the operational amplifier 100 only amplifies the first subtracted signal S1 in the stage 302 in the first operation period T1, and only amplifies the second subtracted signal S2 in the stage 502 in the second operation period T2.

As long as the timing adjustment and error correction circuit 306, 506, or other timing control circuit properly configures the switching timing of the switches 425, 427, 429, 645, 647, 649, 480, and 490, the operational amplifier 100 is enabled to cooperate with other circuits in different stages of the pipelined analog-to-digital converter 500 by turns, so that different stages are enabled to share the same operational amplifier 100.

It can be appreciated from the foregoing descriptions that the combination of the functional blocks 420, 640, 324, 326, 544, and 546 of FIG. 6 can be regarded as another embodiment of the aforementioned prior stage circuit 102 in FIG. 1.

The selected capacitor to be coupled to the second gain stage 120 in each operation period would have been precharged to have a suitable cross voltage value. Therefore, the required time for charging or discharging the selected capacitor after it is coupled to the second gain stage 120 can be significantly reduced. As a result, the response speed of the operational amplifier 100 can be effectively increased, thereby improving the overall performance or operating speed of the pipelined analog-to-digital converter 500.

In addition, by adopting the mechanism of charging the multiple candidate capacitors 131-135 and 151-155 by turns on a group basis and the mechanism of selecting feedback capacitors to be coupled to the second gain stage 120 only from precharged capacitor group described previously, the required time for charging or discharging the selected capacitor after the selected capacitor is coupled to the second gain stage 120 can be further reduced, so that the response speed of the operational amplifier 100 can be further increased, thereby further increasing the overall performance or operating speed of the pipelined analog-to-digital converter 500.

The foregoing descriptions regarding the connections, implementations, operations, and related advantages of the operational amplifier 100 of FIG. 1 are also applicable to the embodiment of FIG. 6. For the sake of brevity, those descriptions will not be repeated here.

Since the operational amplifier 100 can cooperate with other circuit components in two different stages 302 and 502 in different channels, the stages 302 and 502 can share a single shared operational amplifier 100 in operations. As a result, the quantity of operational amplifiers required by the pipelined analog-to-digital converter 500 can be significantly reduced, thereby reducing the overall circuit area of the pipelined analog-to-digital converter 500.

Figure 7:
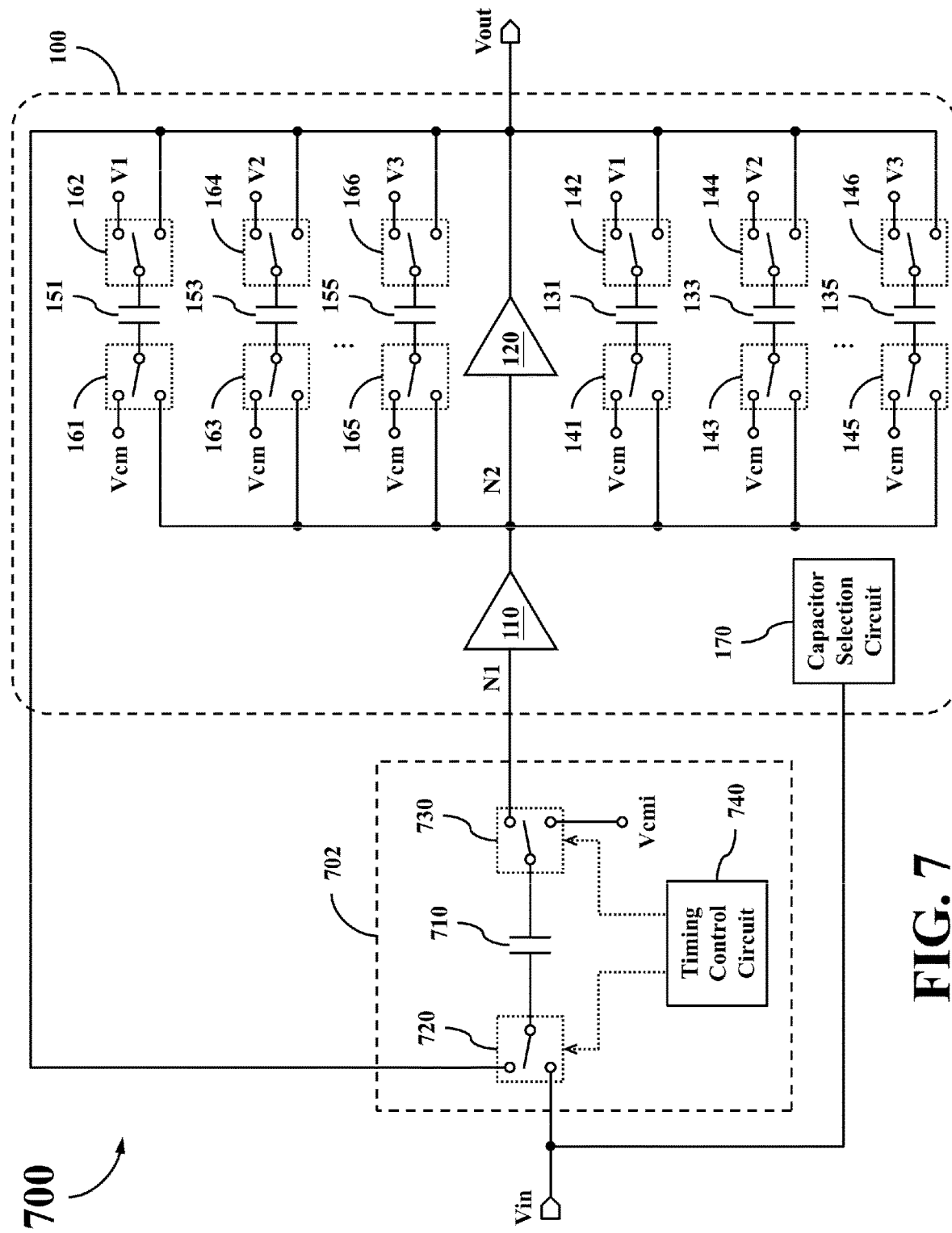
FIG. 7 shows a simplified functional block diagram of a sample-and-hold amplifier according to one embodiment of the present disclosure.

In practice, the disclosed operational amplifier 100 can also be applied in a sample-and-hold amplifier. For example, FIG. 7 shows a simplified functional block diagram of a sample-and-hold amplifier 700 according to one embodiment of the present disclosure.

The sample-and-hold amplifier 700 comprises a switched capacitor network 702 and the aforementioned operational amplifier 100, wherein the switched capacitor network 702 is arranged to operably conduct a sample-and-hole operation on an input signal Vin to generate s sampled signal, and to operably utilize the sampled signal as the first signal N1 to be inputted into the operational amplifier 100.

In this embodiment, the switched capacitor network 702 comprises a sampling capacitor 710, a first sampling switch 720, a second sampling switch 730, and a timing control circuit 740.

The first sampling switch 720 is coupled with a first terminal of the sampling capacitor 710, and arranged to selectively couple the sampling capacitor 710 to the input signal Vin or the output signal Vout.

The second sampling switch 730 is coupled with a second terminal of the sampling capacitor 710, and arranged to selectively couple the sampling capacitor 710 to a predetermined voltage Vcmi or an input terminal of the first gain stage 110. In practice, the predetermined voltage Vcmi may be a fixed voltage, or may be the common mode voltage of the switched capacitor network 702.

In practice, each of the switches 702 and 730 may be realized with a suitable combination of multiple transistors, or may be realized with a suitable combination of multiple transistors and suitable logic gates.

The timing control circuit 740 is coupled with the first sampling switch 720 and the second sampling switch 730, and arranged to operably control the switching timing of the first sampling switch 720 and the second sampling switch 730.

For example, when the timing control circuit 740 controls the first sampling switch 720 to couple the sampling capacitor 710 to the input signal Vin, the timing control circuit 740 would also control the second sampling switch 730 to couple the sampling capacitor 710 to the predetermined voltage Vcmi. When the timing control circuit 740 controls the first sampling switch 720 to couple the sampling capacitor 710 to the output signal Vout, the timing control circuit 740 would also control the second sampling switch 730 to couple the sampling capacitor 710 to the input terminal of the first gain stage 110.

The operational amplifier 100 is coupled with the switched capacitor network 702, and arranged to operably generate the output signal Vout according to the first signal N1 outputted from the switched capacitor network 702. The operational amplifier 100 is further arranged to operably switch the coupling relationships of the multiple candidate capacitors 131-135 and 151-155 based on the magnitude of the input signal Vin of the switched capacitor network 702, so that only part of the multiple candidate capacitors 131-135 and 151-155 can be employed to participate in the generation of the output signal Vout at the same time.

It can be appreciated from the foregoing descriptions that the switched capacitor network 702 in FIG. 7 can be regarded as another embodiment of the aforementioned prior stage circuit 102 in FIG. 1.

The selected capacitor to be coupled to the second gain stage 120 in each time would have been precharged to have a suitable cross voltage value. Therefore, the required time for charging or discharging the selected capacitor after it is coupled to the second gain stage 120 can be significantly reduced. As a result, the response speed of the operational amplifier 100 can be effectively increased, thereby improving the overall performance or operating speed of the sample-and-hold amplifier 700.

In addition, by adopting the mechanism of charging the multiple candidate capacitors 131-135 and 151-155 by turns on a group basis and the mechanism of selecting feedback capacitors to be coupled to the second gain stage 120 only from precharged capacitor group described previously, the required time for charging or discharging the selected capacitor after the selected capacitor is coupled to the second gain stage 120 can be further reduced, so that the response speed of the operational amplifier 100 can be further increased, thereby further increasing the overall performance or operating speed of the sample-and-hold amplifier 700.

The foregoing descriptions regarding the connections, implementations, operations, and related advantages of the operational amplifier 100 of FIG. 1 are also applicable to the embodiment of FIG. 7. For the sake of brevity, those descriptions will not be repeated here.

Please note that the quantity of some components in the previous embodiments is merely an exemplary example, rather than a restriction to the practical implementations. For example, the quantity of comparators employed in the capacitor selection circuit 170 can be doubled in some embodiments, so that the selection logic 240 can measure the range of the magnitude of the input signal Vin more accurately. For another example, the quantity of comparators employed in the capacitor selection circuit 170 can be reduced to two in some embodiments, so as to reduce the circuitry complexity of the selection logic 240.

Additionally, in some embodiments where the requirement to the response speed of the operational amplifier 100 is lower, the aforementioned second capacitor group and associated switches may be omitted. In this situation, a single capacitor group comprising at least three candidate capacitors can be employed to cooperate with the second gain stage 120.

In some embodiments, the output terminal of the first DAC 324 in the embodiment of FIG. 4 or FIG. 6 may be instead coupled to the fourteenth switch 427 to provide the aforementioned predetermined voltage Vr1. Under this structure, when the thirteenth switch 425 couples the first terminal of the first capacitor 421 to the output signal Vout of the operational amplifier 100, while the fourteenth switch 427 couples the first terminal of the second capacitor 423 to the predetermined voltage Vr1, the aforementioned first subtracted signal S1 would be formed at the node where the second terminal of the first capacitor 421 is coupled with the second terminal of the second capacitor 423. In this situation, when the first gain stage 110 requires to be coupled to the first subtracted signal S1, the fifteenth switch 429 may couple both the second terminal of the first capacitor 421 and the second terminal of the second capacitor 423 to the input terminal of the first gain stage 110, and thus the first subtractor 326 can be omitted Similarly, the output terminal of the second DAC 344 (or 544) in the embodiment of FIG. 4 or FIG. 6 may be instead coupled to the seventeenth switch 447 (or 647) to provide the aforementioned predetermined voltage Vr2. Under this structure, when the sixteenth switch 445 (or 645) couples the first terminal of the third capacitor 441 (or 641) to the output signal Vout of the operational amplifier 100, while the seventeenth switch 447 (or 647) couples the first terminal of the fourth capacitor 443 (or 643) to the predetermined voltage Vr2, the aforementioned second subtracted signal S2 would be formed at the node where the second terminal of the third capacitor 441 (or 641) is coupled with the second terminal of the fourth capacitor 443 (or 643). In this situation, when the first gain stage 110 requires to be coupled to the second subtracted signal S2, the eighteenth switch 449 (or 649) may couple both the second terminal of the third capacitor 441 (or 641) and the second terminal of the fourth capacitor 443 (or 643) to the input terminal of the first gain stage 110, and thus the second subtractor 346 (or 546) can be omitted.

In some embodiments, the output switch 480 and the input switch 490 in FIG. 4 and FIG. 6 may be omitted. In this situation, in the period during which the operational amplifier 100 requires to amplify the signal in a certain stage, the digital-to-analog converter of the MDAC in another related stage may be suspended to prevent the first gain stage 110 from receiving an erroneous subtracted signal.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

The term "voltage signal" used throughout the description and the claims may be expressed in the format of a current in implementations, and the term "current signal" used throughout the description and the claims may be expressed in the format of a voltage in implementations.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A pipelined analog-to-digital converter, comprising:
   a first switched capacitor network arranged to operably conduct a sample-and-hold operation on a first input signal;
   a first DAC (digital-to-analog converter) arranged to operably generate a first analog signal corresponding to the first input signal, wherein outputs of the first switched capacitor network and the first DAC form a first subtracted signal;
   a second switched capacitor network arranged to operably conduct a sample-and-hold operation on a second input signal;
   a second DAC arranged to operably generate a second analog signal corresponding to the second input signal, wherein outputs of the second switched capacitor network and the second DAC form a second subtracted signal; and
   an operational amplifier comprising multiple candidate capacitors, and arranged to operably generate an output signal according to a first signal and arranged to operably switch coupling relationships of the multiple candidate capacitors according to a magnitude of an input signal, so that only part of the multiple candidate capacitors are employed to participate in the generation of the output signal at the same time;

wherein the operational amplifier utilizes the first input signal to be the input signal when the operational amplifier utilizes the first subtracted signal to be the first signal; and the operational amplifier utilizes the second input signal to be the input signal when the operational amplifier utilizes the second subtracted signal to be the first signal.

2. The pipelined analog-to-digital converter of claim 1, wherein the operational amplifier comprises:
a first gain stage arranged to operably generate a second signal according to the first signal;
a second gain stage coupled with the first gain stage, and arranged to operably generate the output signal according to the second signal;
a first candidate capacitor;
a second candidate capacitor;
a third candidate capacitor;
a first switch coupled with a first terminal of the first candidate capacitor, and arranged to selectively couple the first candidate capacitor to a first predetermined voltage or an input terminal of the second gain stage;
a second switch coupled with a second terminal of the first candidate capacitor, and arranged to selectively couple the first candidate capacitor to a first voltage or an output terminal of the second gain stage;
a third switch coupled with a first terminal of the second candidate capacitor, and arranged to selectively couple the second candidate capacitor to the first predetermined voltage or the input terminal of the second gain stage;
a fourth switch coupled with a second terminal of the second candidate capacitor, and arranged to selectively couple the second candidate capacitor to a second voltage or the output terminal of the second gain stage;
a fifth switch coupled with a first terminal of the third candidate capacitor, and arranged to selectively couple the third candidate capacitor to the first predetermined voltage or the input terminal of the second gain stage;
a sixth switch coupled with a second terminal of the third candidate capacitor, and arranged to selectively couple the third candidate capacitor to a third voltage or the output terminal of the second gain stage; and
a capacitor selection circuit coupled with the prior stage circuit and the first through the sixth switches, and arranged to operably control the first through the sixth switches based on a magnitude of the input signal, so that only part of the first through the third candidate capacitors can be coupled to the second gain stage at the same time.

3. The pipelined analog-to-digital converter of claim 2, wherein the first through the third candidate capacitors are respectively charged to have different cross voltage values before part of the multiple candidate capacitors are coupled to the second gain stage.

4. The pipelined analog-to-digital converter of claim 3, wherein the capacitor selection circuit comprises:
a plurality of comparators arranged to respectively compare the input signal with a plurality of corresponding reference signals; and
a selection logic coupled with the plurality of comparators, and arranged to operably select a part of the first through the third candidate capacitors to be selected capacitors according to comparison results of the plurality of comparators, and to operably generate multiple control signals for controlling the first through the sixth switches, so as to couple the selected capacitors to the second gain stage.

5. The pipelined analog-to-digital converter of claim 1, wherein the capacitor selection circuit comprises:
a plurality of comparators arranged to respectively compare the input signal with a plurality of corresponding reference signals; and
a selection logic coupled with the plurality of comparators, and arranged to operably select a part of the first through the third candidate capacitors to be selected capacitors according to comparison results of the plurality of comparators, and to operably generate multiple control signals for controlling the first through the sixth switches, so as to couple the selected capacitors to the second gain stage.

6. A pipelined analog-to-digital converter, comprising:
a first switched capacitor network arranged to operably conduct a sample-and-hold operation on a first input signal;
a first DAC arranged to operably generate a first analog signal corresponding to the first input signal, wherein outputs of the first switched capacitor network and the first DAC form a first subtracted signal;
a second switched capacitor network arranged to operably conduct a sample-and-hold operation on a second input signal;
a second DAC arranged to operably generate a second analog signal corresponding to the second input signal, wherein outputs of the second switched capacitor network and the second DAC form a second subtracted signal; and
an operational amplifier comprising multiple candidate capacitors, and arranged to operably generate an output signal according to a first signal and arranged to operably switch coupling relationships of the multiple candidate capacitors based on a magnitude of an input signal, so that only part of the multiple candidate capacitors are employed to participate in the generation of the output signal;
wherein the operational amplifier utilizes the first input signal to be the input signal when the operational amplifier utilizes the first subtracted signal to be the first signal; and the operational amplifier utilizes the second input signal to be the input signal when the operational amplifier utilizes the second subtracted signal to be the first signal;
wherein the multiple candidate capacitors are divided into a first capacitor group and a second capacitor group, and when part of candidate capacitors in the first capacitor group are employed in the generation of the output signal, all candidate capacitors in the second capacitor group are respectively charged to have different cross voltage values.

7. The pipelined analog-to-digital converter of claim 6, wherein the operational amplifier comprises:
a first gain stage arranged to operably generate a second signal according to the first signal;
a second gain stage coupled with the first gain stage, and arranged to operably generate the output signal according to the second signal;
a first candidate capacitor;
a second candidate capacitor;
a third candidate capacitor;
a first switch coupled with a first terminal of the first candidate capacitor, and arranged to selectively couple the first candidate capacitor to a first predetermined voltage or an input terminal of the second gain stage;

a second switch coupled with a second terminal of the first candidate capacitor, and arranged to selectively couple the first candidate capacitor to a first voltage or an output terminal of the second gain stage;

a third switch coupled with a first terminal of the second candidate capacitor, and arranged to selectively couple the second candidate capacitor to the first predetermined voltage or the input terminal of the second gain stage;

a fourth switch coupled with a second terminal of the second candidate capacitor, and arranged to selectively couple the second candidate capacitor to a second voltage or the output terminal of the second gain stage;

a fifth switch coupled with a first terminal of the third candidate capacitor, and arranged to selectively couple the third candidate capacitor to the first predetermined voltage or the input terminal of the second gain stage;

a sixth switch coupled with a second terminal of the third candidate capacitor, and arranged to selectively couple the third candidate capacitor to a third voltage or the output terminal of the second gain stage;

a fourth candidate capacitor;

a fifth candidate capacitor;

a sixth candidate capacitor;

a seventh switch coupled with a first terminal of the fourth candidate capacitor, and arranged to selectively couple the fourth candidate capacitor to the first predetermined voltage or the input terminal of the second gain stage;

an eighth switch coupled with a second terminal of the fourth candidate capacitor, and arranged to selectively couple the fourth candidate capacitor to the first voltage or the output terminal of the second gain stage;

a ninth switch coupled with a first terminal of the fifth candidate capacitor, and arranged to selectively couple the fifth candidate capacitor to the first predetermined voltage or the input terminal of the second gain stage;

a tenth switch coupled with a second terminal of the fifth candidate capacitor, and arranged to selectively couple the fifth candidate capacitor to the second voltage or the output terminal of the second gain stage;

an eleventh switch coupled with a first terminal of the sixth candidate capacitor, and arranged to selectively couple the sixth candidate capacitor to the first predetermined voltage or the input terminal of the second gain stage;

a twelfth switch coupled with a second terminal of the sixth candidate capacitor, and arranged to selectively couple the sixth candidate capacitor to the third voltage or the output terminal of the second gain stage; and a capacitor selection circuit coupled with the prior stage circuit and the first through the twelfth switches, and arranged to operably control the first through the twelfth switches based on a magnitude of the input signal, so that only part of the first through the sixth candidate capacitors can be coupled to the second gain stage at the same time;

wherein when part of the first through the third candidate capacitors are coupled to the second gain stage, the fourth through the sixth candidate capacitors are respectively charged to have different cross voltage values; and when part of the fourth through the sixth candidate capacitors are coupled to the second gain stage, the first through the third candidate capacitors are respectively charged to have different cross voltage values.

8. The pipelined analog-to-digital converter of claim 7, wherein the capacitor selection circuit is further arranged to operably couple part of the first capacitor group to the second gain stage in a first operation period, and to operably couple part of the second capacitor group to the second gain stage in a second operation period after the first operation period.

9. The pipelined analog-to-digital converter of claim 8, wherein the capacitor selection circuit comprises:

a plurality of comparators arranged to respectively compare the input signal with a plurality of corresponding reference signals; and a selection logic coupled with the plurality of comparators, and arranged to operably select part of the first through the third candidate capacitors to be selected capacitors in the first operation period according to comparison results of the plurality of comparators, and to operably generate multiple control signals for controlling the first through the sixth switches, so as to couple the selected capacitors to the second gain stage.

10. The pipelined analog-to-digital converter of claim 7, wherein the capacitor selection circuit comprises:

a plurality of comparators arranged to respectively compare the input signal with a plurality of corresponding reference signals; and a selection logic coupled with the plurality of comparators, and arranged to operably select part of the first through the third candidate capacitors to be selected capacitors in a first operation period according to comparison results of the plurality of comparators, and to operably generate multiple control signals for controlling the first through the sixth switches, so as to couple the selected capacitors to the second gain stage.

* * * * *